US012339319B2

(12) United States Patent
Ou et al.

(10) Patent No.: US 12,339,319 B2
(45) Date of Patent: Jun. 24, 2025

(54) OSCILLATION HANDLING METHOD, APPARATUS USING THE SAME, AND STORAGE MEDIUM

(71) Applicant: SHENZHEN HUAPTEC CO., LTD, Shenzhen (CN)

(72) Inventors: Chuanzhen Ou, Shenzhen (CN); Yanlin Xie, Shenzhen (CN); Yanwei Wang, Shenzhen (CN)

(73) Assignee: SHENZHEN HUAPTEC CO., LTD, Shenzhen (CN)

( * ) Notice: Subject to any disclaimer, the term of this patent is extended or adjusted under 35 U.S.C. 154(b) by 638 days.

(21) Appl. No.: 17/732,551

(22) Filed: Apr. 29, 2022

(65) Prior Publication Data

US 2023/0280397 A1    Sep. 7, 2023

(30) Foreign Application Priority Data

Mar. 4, 2022   (CN) .......................... 202210214360.6

(51) Int. Cl.
   *G01R 31/317*    (2006.01)
(52) U.S. Cl.
   CPC . *G01R 31/31708* (2013.01); *G01R 31/31703* (2013.01)
(58) Field of Classification Search
   CPC ........ G01R 31/31708; G01R 31/31703; H03L 7/00; H03G 3/3036
   See application file for complete search history.

(56) References Cited

U.S. PATENT DOCUMENTS

| 4,914,424 A | * | 4/1990 | Hirao | ................. G01N 27/4065 |
| | | | | 73/1.07 |
| 5,998,899 A | * | 12/1999 | Rosen | ................. F16C 32/0451 |
| | | | | 310/90 |
| 7,859,355 B2 | * | 12/2010 | Brennan | .................... H03L 3/00 |
| | | | | 331/177 V |
| 2006/0234668 A1 | * | 10/2006 | Uchitomi | ............ H04L 27/3818 |
| | | | | 455/252.1 |
| 2012/0237060 A1 | * | 9/2012 | Cho | ........................ H03F 3/217 |
| | | | | 381/121 |
| 2013/0002361 A1 | * | 1/2013 | Coban | .................. H03K 3/0315 |
| | | | | 331/108 R |
| 2014/0176248 A1 | * | 6/2014 | Caffee | ...................... H03B 5/30 |
| | | | | 331/109 |

* cited by examiner

*Primary Examiner* — Shelby A Turner
*Assistant Examiner* — Yaritza H Perez Bermudez

(57) ABSTRACT

The present disclosure discloses an oscillation handling method, an apparatus using the same, and a storage medium. The method includes: obtaining one of a real-time detection voltage and a real-time power of an oscillation system; reducing a gain of the system according to a preset first attenuation value; determining whether the real-time detection voltage meets a first oscillation determination condition; if yes, increase an oscillation determination number by one; restoring the gain of the system to obtain the second real-time detection voltage; determining whether the second real-time detection voltage meets a second oscillation determination condition; if yes, increase the oscillation determination number by two and reduce the gain of the system according to the preset first attenuation value; and determining the preset first attenuation value as a determined oscillation attenuation value in response to the oscillation determination number being larger than or equal to a preset threshold.

8 Claims, 3 Drawing Sheets

OSCILLATION HANDLING METHOD, APPARATUS USING THE SAME, AND STORAGE MEDIUM

CROSS REFERENCE TO RELATED APPLICATIONS

The present disclosure claims priority to Chinese Patent Application No. 202210214360.6, filed Mar. 4, 2022, which is hereby incorporated by reference herein as if set forth in its entirety.

BACKGROUND

1. Technical Field

The present disclosure relates to communication technology, and particularly to an oscillation handling method, an apparatus using the same, and a storage medium.

2. Description of Related Art

Usually, there are two ways to determine the oscillation of a communication system. One of them is based on the beating characteristic of the self-excited signal. For example, when the signal has strong oscillation, the power will be saturated instantaneously. However, due to the protective effect of the (automatic level control) ALC mechanism, it can be observed that the signal is constantly beating at the output end, and each beating can reach the maximum power that the hardware can withstand. The number of beatings is generally counted within a certain period of time, and it will determine that there is an oscillation when the number reaches a certain threshold. The other of them is determined based on whether the power is changed in linear manner. When the power exceeds a certain value, a certain gain is automatically reduced, and the oscillation is determined according to the consistency between the reduced gain and the change amount of the power. After the oscillation is determined successfully, the gain of the corresponding link is adjusted. Each system and link is handled independently and there is no mutual relationship therebetween.

In the existing oscillation handling method, if the determination is based on the phenomenon generated by the surface of the self-excited, there will be two very important drawbacks: one is long processing time, because the spatial signal or the artificially added signal will have sudden beating, a certain time cost will be in evitable for the threshold of beating number used to distinguish the self-excited signal and the normal signal; the other is the large risky and inaccurate of the determination of oscillation, because a high-amplitude and unstable input signal will easy to be mis-determined as self-excited to be handled, or a high-amplitude and stable input signal that is self-excited might be fail determined continuously.

SUMMARY

The purpose of the present disclosure is to provide an oscillation handling method, an apparatus using the same and a storage medium, so as to solve the technical problem of inaccurate oscillation determination in the prior art.

For achieving the above-mentioned object, the present disclosure provides an oscillation handling method comprising:

obtaining one of a real-time detection voltage and a real-time power of an oscillation system at a current moment;

reducing a gain of the system at the current moment according to a preset first attenuation value such that the real-time detection voltage is lower than a rated detection voltage, in response to the real-time power being larger than a rated power or the real-time detection voltage being larger than the rated detection voltage;

determining whether the real-time detection voltage meets the first oscillation condition or not;

increasing an oscillation determination number by one and restoring the gain of the system at the current moment to re-obtain the real-time detection voltage, in response to the real-time detection voltage meeting the first oscillation condition;

determining whether the real-time detection voltage meets the second oscillation determination condition or not;

increasing the oscillation determination number by two and determining whether the real-time detection voltage meets the first oscillation condition after reducing the gain of the system according to the preset first attenuation value in response to the real-time detection voltage meeting the second oscillation determination condition, increasing the oscillation determination number by one in response to the real-time detection voltage meeting the first oscillation condition, and setting the oscillation determination number to zero to exit an oscillation determination in response to the real-time detection voltage not meeting the first oscillation condition; and determining the preset first attenuation value as a determined oscillation attenuation value, in response to the oscillation determination number being larger than or equal to a preset threshold.

Optionally, before the obtaining one of the real-time detection voltage and the real-time power of the oscillation system at the current moment, the method further comprises:

obtaining a rated power detection voltage and a first real-time detection voltage of the oscillation system at the current moment;

reducing the gain of the system at the current moment according to the preset first attenuation value and obtaining a second real-time detection voltage, in response to the first real-time detection voltage being larger than the rated power detection voltage;

determining whether the second real-time detection voltage and the first real-time detection voltage meet the first oscillation determination condition or not, in response to the rated power detection voltage being larger than the second real-time detection voltage; and performing the step of obtaining one of the real-time detection voltage and the real-time power of the oscillation system at the current moment, in response to the difference being larger than a preset first difference.

The first oscillation determination condition is determined based on a N-th real-time detection voltage, the preset first attenuation value, a N−1-th real-time detection voltage, a linear error, and a detection voltage variation coefficient; when the N-th real-time detection voltage is denoted as $V_N$, the N−1-th real-time detection voltage is denoted as $V_{N-1}$, the linear error is denoted as M, the detection voltage variation coefficient is denoted as S, the preset first attenuation value is denoted as G, the first oscillation determination condition is:

$G+M<(V_{N-1}-V_N)/S$, where $N$ is larger than 0.

The second oscillation determination condition is determined based on a N-th real-time detection voltage, the preset first attenuation value, a N+1-th real-time detection voltage, a linear error, and a detection voltage variation coefficient; when the N-th real-time detection voltage is denoted as $V_N$, the N+1-th real-time detection voltage is denoted as $V_{N+1}$, the linear error is denoted as M, the detection voltage variation coefficient is denoted as S, the preset first attenuation value is denoted as G, the second oscillation determination condition is:

$G+M<(V_{N+1}-V_N)/S$, where N is larger than 0.

Optionally, the determining the preset first attenuation value as the determined oscillation attenuation value, in response to the oscillation determination number being larger than or equal to the preset threshold comprises:
  starting a first oscillation timing, and controlling the oscillation system to perform a release attenuation according to the oscillation attenuation value in response to the timing end.

In order to achieve the above-mentioned object, the present disclosure further provides an oscillation handling method for a plurality of linkage oscillation systems, and the oscillation handling method further comprises:
  obtaining the gain of at least an oscillation system after oscillation handling in the linkage oscillation systems by executing the above-mentioned oscillation handling method;
  determining the gain of the oscillation system after oscillation handling with the smallest gain among all the oscillation systems as a preset gain;
  obtaining a gain of systems without oscillation handling in the linkage oscillation systems; and
  for each of the other systems in the linkage oscillation systems, when the gain of the system without oscillation handling is larger than the preset gain:
  determining an isolation degree between each of the other systems in the linkage oscillation systems and the oscillation system after oscillation handling; and
  determining a self-excited linkage attenuation value of each of the other systems in the linkage oscillation systems at the current moment according to the isolation degree, the gain of each of the other systems in the linkage oscillation systems and the preset gain.

In order to achieve the above object, the present disclosure further provides an oscillation handling apparatus, and the oscillation handling apparatus includes:
  a sampling module configured to obtain one of a N-th real-time detection voltage and a N-th real-time power of an oscillation system at a current moment;
  a determination module configured to determine whether the N-th real-time detection voltage meets a first oscillation determination condition or not, determine whether N-th the real-time detection voltage meets a second oscillation determination condition or not, and determine a relationship between an oscillation determination number and a preset threshold, in response to the real-time power being larger than a rated power; and
  a control module configured to reduce a gain of the system at the current moment according to a preset first attenuation value to obtain N-th real-time detection voltage in response to a N−1-th real-time detection voltage being larger than a rated detection voltage, restore the gain of the system at the current moment and increase an oscillation determination number by one in response to the N-th real-time detection voltage meeting the first oscillation determination condition to obtain the N+1-th real-time detection voltage, reduce the gain of the system at the current moment according to the preset first attenuation value to continue the determination in response to the N+1-th real-time detection voltage meeting the second oscillation condition; determining the preset first attenuation value as a determined oscillation attenuation value in response to the oscillation determination number being larger than or equal to a preset threshold; and set the oscillation determination number to zero to exit an oscillation determination, in response to the oscillation determination number being less than the preset threshold and not meeting the first and second oscillation determination conditions.

In order to achieve the above-mentioned object, the present disclosure further provides a storage medium stored with at least one executable instruction. When the executable instruction is executed on an electronic device, the electronic device performs the operations of the oscillation method as described above.

The present disclosure, the method includes: obtaining one of a real-time detection voltage and a real-time power of an oscillation system at a current moment; reducing a gain of the system at the current moment according to a preset first attenuation value such that the real-time detection voltage is lower than a rated detection voltage, in response to the real-time power being larger than a rated power or the real-time detection voltage being larger than the rated detection voltage; determining whether the real-time detection voltage meets a first oscillation condition or not; restoring the gain of the system at the current moment and increasing an oscillation determination number by one to re-obtain the real-time detection voltage, in response to the real-time detection voltage meeting the first oscillation condition; determining whether the real-time detection voltage meets a second oscillation determination condition or not; reducing the gain of the system at the current moment according to the preset first attenuation value so as to determine in the similar manner; and determining the preset first attenuation value as a determined oscillation attenuation value, in response to the oscillation determination number being larger than or equal to a preset threshold. The above-mentioned method realizes the process of multiple gain reductions and gain restorations by determining whether the first self-excited determination condition and the second self-excited determination condition are met for multiple times and increasing the oscillation determination number whenever the determination is successful. In such manner, the accuracy of the oscillation determination can be fully ensured, thereby solving the technical problem of inaccurate oscillation determination in the prior art.

BRIEF DESCRIPTION OF THE DRAWINGS

The present disclosure will be further described below in conjunction with drawings and embodiments.

DETAILED DESCRIPTION

Figure 1:
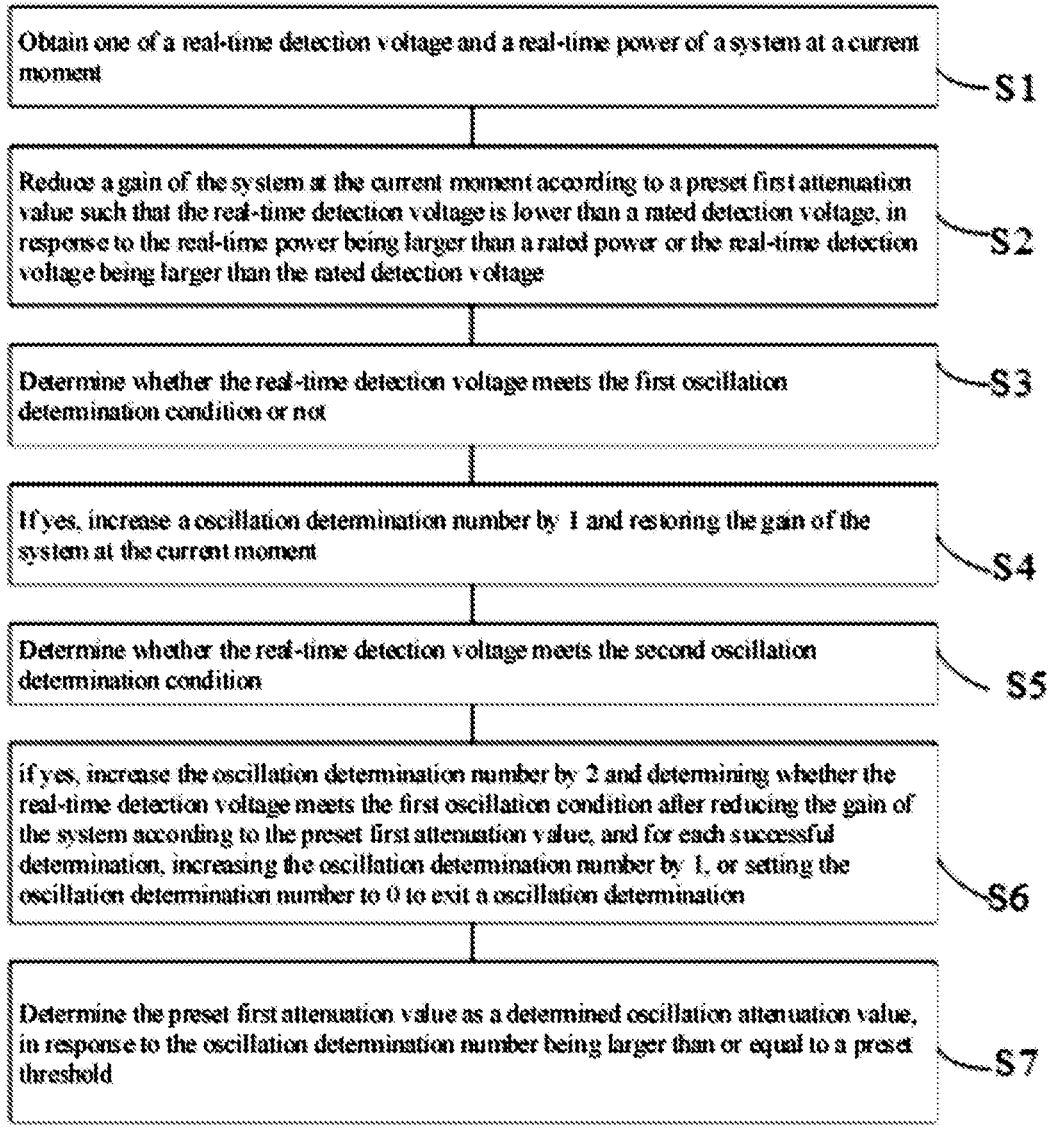
FIG. 1 is a flow chart of an oscillation handling method according to an embodiment of the present disclosure.

In here, the embodiments of the present disclosure will be described in detail, and the preferred embodiments of the present disclosure will be shown in the drawings. The drawings are for supplementing the textual descriptions of the specification with graphics so that each technical feature and the overall technical solution of the present disclosure can intuitively and vividly understand, while they should not be construed as for limiting the protection scope of the present disclosure.

In order to solve the technical problem of inaccurate oscillation determination in the prior art, the present disclosure provides an oscillation handling method, an apparatus using the same, and a storage medium.

In one embodiment, as shown in FIG. 1, an oscillation handling method includes:

S1: obtaining one of a real-time detection voltage and a real-time power of an oscillation system at a current moment.

In one oscillation system, the real-time detection voltage or real-time power may be obtained in real time through a feedback circuit or a corresponding type of collection circuit. It should be noted that, the oscillation system refers to a system with a complete self-excited working loop. In the oscillation system, the gain may be adjusted through sampling and feedback. In addition, the real-time power of a device may also be calculated from the detection voltage according to our calibration. For example, because we can calibrate the corresponding output power as 10 dBm when the detection voltage is 1000, these two values are the same concept here. Any one of them can be obtained to achieve the purpose of the present disclosure.

S2: reducing a gain of the system at the current moment according to a preset first attenuation value such that the real-time detection voltage is lower than a rated detection voltage, in response to the real-time power being larger than a rated power or the real-time detection voltage being larger than the rated detection voltage.

When the real-time power is larger than the rated power, it indicates that the system may be self-excited and the gain needs to be reduced. Because this is a preliminary determination process, the variations of the real-time detection voltage under various conditions may be considered.

S3: determining whether the real-time detection voltage meets a first oscillation determination condition or not.

In the N-th determination, if N is an odd number, it determines whether the real-time detection voltage meets the first oscillation determination condition or not; otherwise, it determines whether the real-time detection voltage meets the second oscillation determination condition.

S4: if yes, increase an oscillation determination number by 1 and restoring the gain of the system at the current moment.

In which, if the N-th determination represents meeting, the oscillation determination number is increased by 1. If N is an odd number, the gain of the system at the current moment is restored; otherwise, the gain of the system at the current moment is reduced according to the preset first attenuation value. If the oscillation determination number is smaller than the preset threshold, it returns to step S4 to repeat the determination. At this time, the restoration corresponds to the previous reduction of the gain. When the original signal has a sudden change or other changes, it will make a certain determination condition at this time cannot be met, thereby exiting the determination process to avoid mis-determination.

S5: determining whether the real-time detection voltage meets a second oscillation determination condition.

S6: if yes, increase the oscillation determination number by 2 and determining whether the real-time detection voltage meets the first oscillation condition after reducing the gain of the system according to the preset first attenuation value, and for each successful determination, increasing the oscillation determination number by 1, or setting the oscillation determination number to 0 to exit an oscillation determination.

S7: determining the preset first attenuation value as a determined oscillation attenuation value, in response to the oscillation determination number being larger than or equal to a preset threshold.

Through the forgoing process, the accumulation of multiple determination processes can be performed, thereby making the determination process more accurate. It should be noted that, when the number of oscillation is less than the preset threshold or the oscillation determination condition is not met, the oscillation determination number is set to 0 and the determination process is exited.

The forgoing scheme realizes the process of multiple gain reductions and gain restorations by determining whether the first self-excited determination condition and the second self-excited determination condition are met for multiple times and increasing the oscillation determination number whenever the determination is successful. In such manner, the accuracy of the oscillation determination can be fully ensured, thereby solving the technical problem of inaccurate oscillation determination in the prior art.

It should be noted that, the forgoing scheme uses the positive feedback amplification characteristic of oscillation so that the determination of the above-mentioned oscillation handling method can only be performed when the output power is larger than the rated power.

Figure 2:
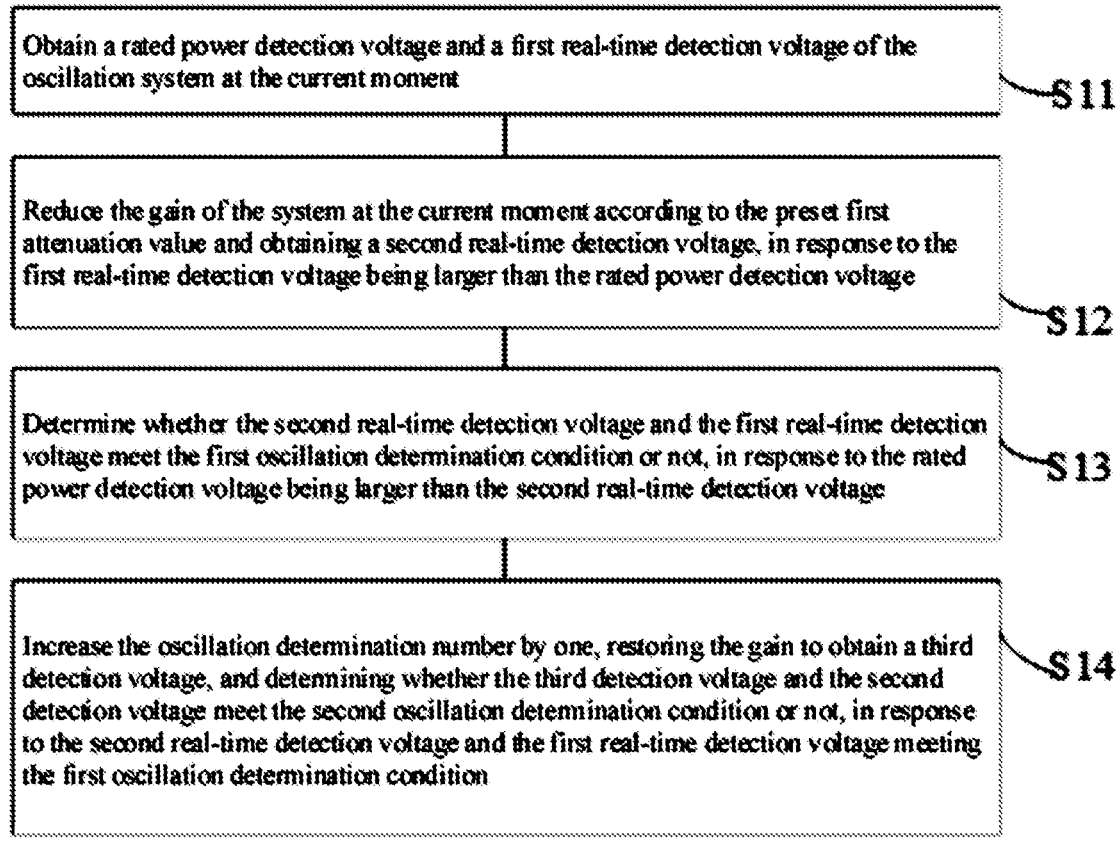
FIG. 2 is a flow chart of an oscillation handling method according to another embodiment of the present disclosure.

FIG. 2 is a flow chart of an oscillation handling method according to another embodiment of the present disclosure. As shown in FIG. 2, in one embodiment, before obtaining one of the real-time detection voltage and the real-time power of the oscillation system at the current moment (step S10), the method further includes:

S11: obtaining a rated power detection voltage and a first real-time detection voltage of the oscillation system at the current moment.

S12: reducing the gain of the system at the current moment according to the preset first attenuation value and obtaining a second real-time detection voltage, in response to the first real-time detection voltage being larger than the rated power detection voltage.

The first real-time detection voltage larger than the rated power detection voltage indicates that the oscillation system at this time needs to reduce the gain, while the first real-time detection voltage less than the rated power detection voltage indicates that the oscillation system does not need to reduce the gain. Through the above-mentioned determination, mis-determinations can be avoided.

S13: determining whether the second real-time detection voltage and the first real-time detection voltage meet a first oscillation determination condition or not, in response to the rated power detection voltage being larger than the second real-time detection voltage.

In which, when the rated power detection voltage is smaller than the second real-time detection voltage, the preset first attenuation value is continue to be increased to re-obtain the second real-time detection voltage and perform this step for the determination.

S14: increasing the oscillation determination number by one, restoring the gain to obtain a third detection voltage, and determining whether the third detection voltage and the second detection voltage meet a second oscillation determination condition or not, in response to the second real-time detection voltage and the first real-time detection voltage meeting the first oscillation determination condition.

The forgoing process is the process before the N-th oscillation determination. Through the forgoing process, the voltage condition of the oscillation system at this time can be preliminarily determined, and the preliminary prediction can be achieved through a relatively simple processing process, thereby reducing the hardware requirements.

Optionally, the first oscillation determination condition is determined based on a N-th real-time detection voltage, the preset first attenuation value, a N−1-th real-time detection voltage, a linear error, and a detection voltage variation coefficient; when the N-th real-time detection voltage is denoted as $V_N$, the N−1-th real-time detection voltage is denoted as $V_{N-1}$, the linear allowable error is denoted as M, the detection voltage variation coefficient is denoted as S, the preset first attenuation value is denoted as G, the first oscillation determination condition is:

$$G+M<(V_{N-1}-V_N)/S, \text{ where } N \text{ is larger than } 0.$$

Optionally, the second oscillation determination condition is determined based on a N-th real-time detection voltage, the preset first attenuation value, a N+1-th real-time detection voltage, a linear error, and a detection voltage variation coefficient; when the N-th real-time detection voltage is denoted as $V_N$, the N+1-th real-time detection voltage is denoted as $V_{N+1}$, the linear error is denoted as M, the detection voltage variation coefficient is denoted as S, the preset first attenuation value is denoted as G, the second oscillation determination condition is:

$$G+M<(V_{N+1}-V_N)/S, \text{ where } N \text{ is larger than } 0.$$

Based on the above-mentioned embodiment, the principle of the present disclosure will be described below with N=4:
  obtaining the 4-th real-time detection voltage of the oscillation system at the current moment;
  determining whether the 4-th real-time detection voltage meets the first oscillation determination condition or not;
  at this time, $G+M<(V_3-V_4)/S$;
  if yes, restore the gain of the system at the current moment according to the preset first attenuation value, and increase the oscillation determination number by one to obtain the 5-th real-time detection voltage;
  determining whether the 5-th real-time detection voltage meets the second oscillation determination condition;
  at this time, $G+M<(V_5-V_4)/S$;
  if yes, increase the oscillation determination number by one and reduce the gain of the system at the current moment according to the preset first attenuation value; and
  determining the preset first attenuation value as the determined oscillation attenuation value, in response to the oscillation determination number being larger than or equal to the preset threshold.
  S7: determining the preset first attenuation value as a determined oscillation attenuation value, in response to the oscillation determination number being larger than or equal to a preset threshold.

Specifically, the forgoing process is as follows. The 1st real-time detection voltage is sampled and denoted as V1, then the gain is reduced so that the output is smaller than the rated power to denote the reduced gain as G. At this time, the second real-time detection voltage is denoted as V2, and the variation coefficient of the detection voltage, that is, the detection voltage corresponding to the gain per dB is known as S, then theoretically there is a relationship of G=(V1−V2)/S in the case of not oscillation and a relationship of G<(V1−V2)/S in the case of oscillation. But in fact, due to the linearity difference of hardware components needs to be determined with the assistance of a variable linear allowable error M, the determination relationship for determining the existing of oscillation becomes to: the first oscillation determination condition of G+M<(V1−V2)/S. After the result of the first linearity oscillation determination is yes, the gain is restored, and the 3-rd real-time detection voltage is denoted as V3. At this time, the oscillation determination relationship becomes to: the second oscillation determination condition of G+M<(V3−V2)/S. The sum of the two is the oscillation determination number of 2. In order to reduce the probability of mis-determination, it is more appropriate to determine the oscillation determination number more than 4 times. In the linearity determination process, if it is not met once, the determination will be withdrawn. After all the determinations are successful, the gain G will be reduced, and an oscillation handling is completed. For preventing the mis-determination of device or the variation of the isolation degree in the process of actual application, the oscillation handling needs to make four successful determinations before maintaining the gain to a safe state.

In the above-mentioned embodiment, because multiple self-excited handling mechanisms are used for mutual cooperation and joint processing, the processing speed can be greatly improved. Furthermore, the forgoing method is more accurate for the determination of the unstable beating signal, and is not prone to mis-determine the oscillation occurrence condition.

In one embodiment, after the step (S7) of determining the preset first attenuation value as the determined oscillation attenuation value, in response to the oscillation determination number being larger than or equal to the preset threshold, the method further includes:
  starting a first oscillation timing, and controlling the oscillation system to perform a release attenuation according to the oscillation attenuation value in response to the timing end.

In an exemplary technology, because the oscillation of the uplink signal will directly interfere with the base station, and the stability of the amplitude of the uplink signal is lower than that of the downlink signal, the processing of the uplink signal is more important or difficult than that of the downlink signal. In order to avoid oscillation in the uplink, the ALC linkage method is adopted, that is, the attenuation for the downlink power when it reaches the rated power needs to be linked to the uplink, and always ensure that the gain of the uplink is smaller than that of the downlink. In some devices with similar uplink and downlink gains or strict oscillation handling requirements, the ALC linkage method performed in advance is even adopted, that is, the uplink will begin to reduce the gain before the downlink reaches the rated power. When the uplink gain is smaller than the downlink gain, there may be a situation that the uplink has not reached the oscillation while the downlink has handled the oscillation. At this time, it is necessary to link the oscillation attenuation value to the uplink to ensure that the uplink gain is always lower than the downlink gain. The linearity oscillation determination method cannot effectively determine the oscillation when the actual effective signal has larger amplitude, and the effect of solely using this method will be not ideal.

Figure 3:
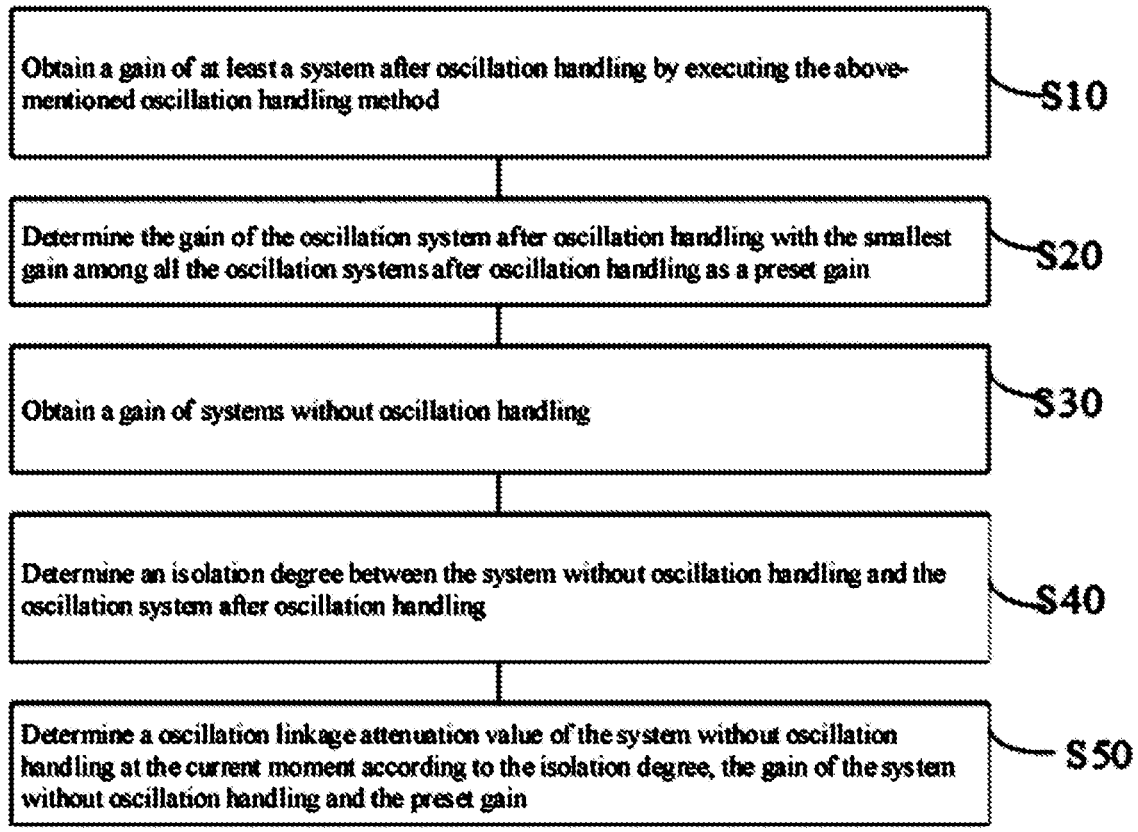
FIG. 3 is a flow chart of an oscillation handling method according to the other embodiment of the present disclosure.

FIG. 3 is a flow chart of an oscillation handling method according to the other embodiment of the present disclosure. As shown in FIG. 3, in order to achieve the forgoing purpose, the present disclosure further provides another oscillation handling method which is used for a plurality of linked oscillation systems. The oscillation handling method includes:

S10: obtaining the gain of at least an oscillation system after oscillation handling by executing the above-mentioned oscillation handling method;

S20: determining the gain of the oscillation system after oscillation handling with the smallest gain among all the oscillation systems as a preset gain;

S30: obtaining a gain of systems without oscillation handling; and for each of the other systems in the linkage oscillation systems, when the gain of the system without oscillation handling is larger than the preset gain:

S40: determining an isolation degree between the other systems in the linkage oscillation systems and the oscillation system after oscillation handling; and S50: determining a oscillation linkage attenuation value of the other systems in the linkage oscillation systems at the current moment according to the isolation degree, the gain of the other systems in the linkage oscillation systems and the preset gain.

In the above-mentioned embodiment, taking a dual-system device as an example, the dual-system device includes a first oscillation system and a second oscillation system. When the gain of the first oscillation system after the oscillation processing is G, the gain of the second oscillation system is H, the isolation degree of the first oscillation system in the current environment is larger than that of the second oscillation system by K, and H+K>G, then regardless of whether the second oscillation system is self-excited, the self-excited linkage attenuation value of the second oscillation system that needs to be linked will be (H+K−G). It should be noted that, there will be differences in K at different system frequencies and in different test environments. When handling oscillation linkage in multiple systems, after the isolation degree compensation caused by frequency and environment, the minimum gain Gmin in the system that the oscillation handling is successful should be found first, and the minimum gain Gmin should be set as the preset gain. Then, Gmin is used to compare the gain of each system, and each oscillation system with the gain larger than Gmin needs to link the corresponding self-excited linkage attenuation value to reduce the gain to Gmin, so as to prevent from or eliminate those oscillation that cannot be processed. By adding a variety of linkage methods, it can effectively prevent and handle the uplink oscillation, and at the same time reduce the possibility that the oscillation cannot be handled, thereby improving the availability of the device.

In order to solve the above-mentioned problems, the present disclosure further provides an oscillation handling apparatus. The oscillation handling apparatus includes:

a sampling module configured to obtain one of a N-th real-time detection voltage and a N-th real-time power of an oscillation system at a current moment;

a determination module configured to determine whether the N-th real-time detection voltage meets a first oscillation determination condition or not, determine whether N-th the real-time detection voltage meets a second oscillation determination condition or not, and determine a relationship between an oscillation determination number and a preset threshold, in response to the real-time power being larger than a rated power; and a control module configured to reduce a gain of the system at the current moment according to a preset first attenuation value to obtain a N-th real-time detection voltage in response to a N−1-th real-time detection voltage being larger than a rated detection voltage, and reduce the gain of the system at the current moment according to the preset first attenuation value and increase an oscillation determination number by one in response to the N-th real-time detection voltage meeting the first oscillation determination condition to obtain the N+1-th real-time detection voltage, and increase the oscillation determination number by one and restore the gain of the system at the current moment to continue the determination in response to the N+1-th real-time detection voltage meeting the second oscillation condition; determining the preset first attenuation value as a determined oscillation attenuation value in response to the oscillation determination number being larger than or equal to a preset threshold; and setting the oscillation determination number to zero to exit an oscillation determination, in response to the oscillation determination number being less than the preset threshold and the oscillation determination fail.

The forgoing scheme realizes the process of multiple gain reductions and gain restorations by determining whether the first self-excited determination condition and the second self-excited determination condition are met for multiple times and increasing the oscillation determination number whenever the determination is successful. In such manner, the accuracy of the oscillation determination can be fully ensured, thereby solving the technical problem of inaccurate oscillation determination in the prior art.

In order to solve the above-mentioned problems, the present disclosure further provides a non-transitory computer readable storage medium storing at least one executable instruction. When the executable instruction is executed on an electronic device, the electronic device performs the operations of the above-mentioned oscillation handling method.

It should be noted that, since the storage medium of the present disclosure includes all the steps of the above-mentioned oscillation handling method, the storage medium can also implement all the solutions of the oscillation handling method, and have the same beneficial effects, which will not be repeated herein.

An oscillation handling method in the above method embodiments is performed. The apparatus embodiment described above is only illustrative, and the units described as separate components may or may not be physically separated, that is, may be located in one place, or may be distributed to multiple network units. Some or all of the modules may be selected according to actual needs to achieve the purpose of the solution of this embodiment. Those ordinary skill in the art can understand that all or some of the steps and systems in the methods disclosed above can be implemented as software, firmware, hardware, and appropriate combinations thereof. Some or all physical components may be implemented as software executed by a processor such as a central processing unit, a digital signal processor, or a microprocessor, be implemented as a hardware, or be implemented as an integrated circuit such as an application specific integrated circuit. Such software may be distributed on computer-readable media which may include computer storage media (or non-transitory media) and communication media (or transitory media). As known to those ordinary skill in the art, the term "computer storage media" includes volatile/nonvolatile and removable/non-removable media for storage of information (e.g., computer readable instructions, data structures, program modules, or other data) that are implemented in any method or technology. The computer storage media may include, but are not limited to, RAM, ROM, EEPROM, flash memory or other memory means, CD-ROM, digital versatile disc (DVD) or other optical disk storage, magnetic cartridges, magnetic tape, magnetic disk storage or other magnetic storage devices, or any other medium for storing the desired information and can be accessed by a computer. In addition, as is well known to those ordinary skill in the art, the communication media usually includes computer readable instructions, data structures, program modules, or other data in a modulated data signal such as a carrier wave or other transport mechanism, and can include any information delivery media.

The technical features of the above-mentioned embodiments can be combined arbitrarily. For the sake of brevity, not all possible combinations of the technical features in the above-mentioned embodiments are described. However, as long as there is no contradiction in the combination of these technical features, the combination shall be considered as within the scope described in this specification.

What is claimed is:

1. An oscillation handling method, comprising:
   obtaining one of a real-time detection voltage and a real-time power of an oscillation system at a current moment;
   reducing a gain of the system at the current moment according to a preset first attenuation value such that the real-time detection voltage is lower than a rated detection voltage, in response to the real-time power being larger than a rated power or the real-time detection voltage being larger than the rated detection voltage;
   determining whether the real-time detection voltage meets a first oscillation determination condition or not;
   increasing an oscillation determination number by one and restoring the gain of the system at the current moment, in response to the real-time detection voltage meeting the first oscillation determination condition;
   determining whether the real-time detection voltage meets a second oscillation determination condition or not;
   increasing the oscillation determination number by two and determining whether the real-time detection voltage meets the first oscillation determination condition after reducing the gain of the system according to the preset first attenuation value in response to the real-time detection voltage meeting the second oscillation determination condition, increasing the oscillation determination number by one in response to the real-time detection voltage meeting the first oscillation determination condition, and setting the oscillation determination number to zero to exit an oscillation determination in response to the real-time detection voltage not meeting the first oscillation determination condition; and
   determining the preset first attenuation value as a determined oscillation attenuation value, in response to the oscillation determination number being larger than or equal to a preset threshold.

2. The oscillation handling method of claim 1, wherein before the obtaining one of the real-time detection voltage and the real-time power of the oscillation system at the current moment, the method further comprises:
   obtaining a rated power detection voltage and a first real-time detection voltage of the oscillation system at the current moment;
   reducing the gain of the system at the current moment according to the preset first attenuation value and obtaining a second real-time detection voltage, in response to the first real-time detection voltage being larger than the rated power detection voltage;
   determining whether the second real-time detection voltage and the first real-time detection voltage meet a first oscillation determination condition or not, in response to the rated power detection voltage being larger than the second real-time detection voltage; and
   increasing the oscillation determination number by one, restoring the gain to obtain a third detection voltage, and determining whether the third detection voltage and the second detection voltage meet a second oscillation determination condition or not, in response to the second real-time detection voltage and the first real-time detection voltage meeting the first oscillation determination condition.

3. The oscillation handling method of claim 1, wherein the first oscillation determination condition is determined based on a N-th real-time detection voltage, the preset first attenuation value, a N−1-th real-time detection voltage, a linear error, and a detection voltage variation coefficient; when the N-th real-time detection voltage is denoted as $V_N$, the N−1-th real-time detection voltage is denoted as $V_{N-1}$, the linear error is denoted as M, the detection voltage variation coefficient is denoted as S, the preset first attenuation value is denoted as G, the first oscillation determination condition is:

$$G+M<(V_{N-1}-V_N)/S, \text{ where } N \text{ is larger than } 0.$$

4. The oscillation handling method of claim 1, wherein the second oscillation determination condition is determined based on a N-th real-time detection voltage, the preset first attenuation value, a N+1-th real-time detection voltage, a linear error, and a detection voltage variation coefficient; when the N-th real-time detection voltage is denoted as $V_N$, the N+1-th real-time detection voltage is denoted as $V_{N+1}$, the linear error is denoted as M, the detection voltage variation coefficient is denoted as S, the preset first attenuation value is denoted as G, the second oscillation determination condition is:

$$G+M<(V_{N+1}-V_N)/S, \text{ where } N \text{ is larger than } 0.$$

5. The oscillation handling method of claim 1, wherein the determining the preset first attenuation value as the determined oscillation attenuation value, in response to the oscillation determination number being larger than or equal to the preset threshold comprises:
   starting a first oscillation timing, and controlling the oscillation system to perform a release attenuation according to the oscillation attenuation value in response to the timing end.

6. The oscillation handling method of claim 1, wherein the oscillation handling method is used in a plurality of linkage oscillation systems, and the oscillation handling method further comprises:
   obtaining the gain of at least a system after oscillation handling in the linkage oscillation systems by executing the oscillation handling method of claim 1;

determining the gain of the system after oscillation handling with a smallest gain among all the oscillation systems as a preset gain;

obtaining a gain of systems without oscillation handling in the linkage oscillation systems; and for each of the other systems in the linkage oscillation systems, when the gain of the system without oscillation handling is larger than the preset gain:

determining an isolation degree between each of the other systems in the linkage oscillation systems and the system after oscillation handling; and determining a oscillation linkage attenuation value of each of the other systems in the linkage oscillation systems at the current moment according to the isolation degree, the gain of each of the other systems in the linkage oscillation systems and the preset gain.

7. An oscillation handling apparatus, comprising:

a sampling module configured to obtain one of a N-th real-time detection voltage and a N-th real-time power of an oscillation system at a current moment;

a determination module configured to determine whether the N-th real-time detection voltage meets a first oscillation determination condition or not, determine whether N-th the real-time detection voltage meets a second oscillation determination condition or not, and determine a relationship between an oscillation determination number and a preset threshold, in response to the real-time power being larger than a rated power; and a control module configured to reduce a gain of the system at the current moment according to a preset first attenuation value to obtain N-th real-time detection voltage in response to a N−1-th real-time detection voltage being larger than a rated detection voltage, and increase an oscillation determination number by one in response to the N-th real-time detection voltage meeting the first oscillation determination condition; restore the gain of the system at the current moment and obtain a N+1-th real-time detection voltage, and increase the oscillation determination number by one in response to the N+1-th real-time detection voltage meeting the second oscillation condition; determining the preset first attenuation value as a determined oscillation attenuation value, in response to the oscillation determination number being larger than or equal to a preset threshold; and setting the oscillation determination number to zero to exit an oscillation determination, in response to the oscillation determination number being less than the preset threshold and not meeting the first and second oscillation determination conditions.

8. A non-transitory computer readable storage medium stored with at least one executable instruction, wherein when the executable instruction is executed on an electronic device, the electronic device is made to perform the oscillation handling method of claim 1.

* * * * *